(12) United States Patent
Abele

(10) Patent No.: US 6,392,518 B1
(45) Date of Patent: May 21, 2002

(54) OPEN UNIPOLAR MAGNETIC STRUCTURE

(75) Inventor: Manlio G. Abele, New York, NY (US)

(73) Assignee: New York University, New York, NY (US)

( * ) Notice: Subject to any disclaimer, the term of this patent is extended or adjusted under 35 U.S.C. 154(b) by 0 days.

(21) Appl. No.: 09/597,055

(22) Filed: Jun. 20, 2000

Related U.S. Application Data

(63) Continuation-in-part of application No. 09/069,389, filed on Apr. 29, 1998.

(51) Int. Cl.[7] ................................................. H01F 5/00
(52) U.S. Cl. ...................................... 335/299; 335/296
(58) Field of Search ................................. 335/216, 296, 335/299; 318/318–321

(56) References Cited

U.S. PATENT DOCUMENTS

| | | | | |
|---|---|---|---|---|
| 4,679,022 A | * | 7/1987 | Miyamoto et al. | 335/296 |
| 5,467,769 A | * | 11/1995 | Yoshino et al. | 335/306 |
| 5,494,222 A | * | 2/1996 | Abele et al. | 335/299 |
| 5,557,205 A | * | 9/1996 | Ohta et al. | 324/319 |
| 5,565,834 A | * | 10/1996 | Hanley et al. | 335/296 |

FOREIGN PATENT DOCUMENTS

| | | | |
|---|---|---|---|
| JP | 7-201557 | * | 8/1995 |
| JP | 8-45729 | * | 2/1996 |

* cited by examiner

*Primary Examiner*—Lincoln Donovan
(74) *Attorney, Agent, or Firm*—Darby & Darby

(57) ABSTRACT

An open unipolar magnetic structure allowing an arbitrary location of a region of interest which will contain a uniform magnetic field within a cavity. In a preferred embodiment, a yoked magnetic structure is modified to reduce the field perturbations in the region of interest when the latter is arbitrarily located within the cavity. The modification includes the provision of supplemental permanent magnetic members at the opening, the configuration of the supplemental permanent magnetic members being related to the configuration of some of the permanent magnetic members of the magnetic structure that provides the uniform magnetic field.

8 Claims, 3 Drawing Sheets

OPEN UNIPOLAR MAGNETIC STRUCTURE

RELATED APPLICATION

This application is a continuation-in-part of commonly assigned U.S. application, Ser. No. 09/069,389, filed Apr. 29, 1998 (now pending).

The invention of this application is directed to a magnetic structure for generating a highly uniform magnetic field using permanently magnetized blocks of magnetic material as the predominant generator of the uniform magnetic field in a desired region of interest.

BACKGROUND OF INVENTION

Commonly-owned U.S. Pat. Nos. 5,475,355 and 5,495,222, whose contents are herein incorporated by reference, describe, among other things, a generally C-shaped magnetic structure for generating uniform magnetic fields in a region of interest, for example, for use in magnetic resonance imaging (MRI) by means of a relatively open magnetic structure allowing surgical intervention during an MRI procedure. Among the features described in those two patents are various schemes for compensating for field distortions introduced by, among other things, the opening of the structure.

A commonly-owned, copending application, Ser. No. 08/754,916, filed Nov. 22, 1996, whose contents, including the contents of the patents incorporated by reference in the said copending application and the contents of a continuation-in-part application, Ser. No. 08/885,095, are herein incorporated by reference, describes apparatus for generating uniform magnetic fields in a region of interest employing wedge-shaped blocks as the primary generator of the main magnetic field. A major thrust of this application is how to generate a field that is sufficiently uniform for use in MRI by means of a relatively open magnetic structure allowing surgical intervention during an MRI procedure.

While the magnetic structures described in these referenced patents and applications are suitable for their intended purpose, nevertheless a possible shortcoming is the generation of a substantial fringe field in the medium surrounding the magnetic structure as a result of opening up the structure for surgical intervention. The fringe field can undesirably interfere with a surgeon's use within or adjacent the magnetic structure of various instruments and equipment which may be of ferromagnetic material and may be subject to magnetic field forces.

The parent application, Ser. No. 09/069,389, whose contents, including the contents of the patents and publications incorporated by reference in the said copending application, are herein incorporated by reference, describes a new open magnetic structure for MRI with two principal novel features. The first is what is referred to as a unipolar structure. Most permanent magnetic structures employed in this field possess two distinct opposed poles, and the main magnetic field through the region of interest in a cavity in the magnetic structure flows directly between the opposed pole faces. The unipolar structure of the parent application is unusual because it has only one distinct pole which faces the opening provided for accessing the region of interest, the opening normally being the place where the second pole would be located if the opening were not present. The main magnetic field still flows from the unipole through the region of interest but is now collected by the magnetic members adjacent the opening. As explained in that application, opening such a structure to provide access to the cavity provides field perturbations that are unacceptable for MRI applications. The second novel feature is to configure the structure to form at the location of the opening, i.e., where the cavity interfaces with the non-magnetic external medium, an equipotential surface. This is the equivalent of the equipotential surface formed by having a high-permeability membrane parallel to the single pole piece present which closes off the interface and thus the opening. This design constraint was described as a hypothetical high permeability membrane present where the open second side of the cavity will be made, the high permeability membrane forming the desired equipotential surface at the interface with the surrounding medium. The presence of the equipotential surface at the opening represented by the hypothetical high permeability membrane, in effect, extends the uniform field up to the opening. This minimizes the fringe field generated in the surrounding medium when the second side of the cavity, when this hypothetical high permeability membrane is removed, is opened.

A limitation of that open unipolar magnetic structure is that the region of interest is most uniform close to the bottom side or first side of the cavity which comprises a high permeability ferromagnetic member interfacing with the first side of the cavity and forming the single pole piece of the magnetic structure. There may be applications of an open unipolar magnetic structure where it is desirable to be able to arbitrarily locate the region of interest within the cavity. Usually, it would be preferred to move the region of interest closer to the opening at the top or second side of the cavity simplifying access by a surgeon to the part of a patient located in the region of interest.

DEFINITION OF TERMS

A "high permeability" member means a soft ferromagnetic body having a permeability $\mu$ exceeding 10 and preferably as high as possible. In several of the referenced patents and publications, as well as in this application, it is sometimes referred to as a ($\mu=\infty$) material, in other words, an ideal soft ferromagnetic body. Practically speaking, the differences in function of a ($\mu=\infty$) material and a high permeability material are small. The behavior of infinite permeability ferromagnetic material can be approximated to a high degree of accuracy by soft iron as long as it is not magnetically saturated.

A "yoked magnetic system" means a permanent magnetic structure surrounded by a body of high permeability material—typically called a yoke—that functions to carry the return flux of the induction B from one pole of the magnetic structure to the other pole. To perform this function, typically the yoke requires a significant cross sectional area sufficient to convey the flux without saturating, and often has a varying cross section in accordance with the local flux-carrying requirement.

A "strap" means a high permeability member that functions to establish a unipotential or equipotential surface within or at the surface of a permanent magnet that may have inhomogeneities due to manufacturing tolerances and whose interior region or a surface thus deviates from what should have been an equipotential surface. In other words, the strap functions to create the equipotential condition that would have existed if the magnet were ideal with perfect materials and geometry. An external strap is somewhat equivalent to the yoke of a magnet, the basic difference between the yoke and the external strap being that the strap function is limited to closing the flux of the statistical fluctuation of the magnetic induction, i.e., to eliminate the components of the field parallel to the strap surface, while the yoke is designed to close the entire flux generated by the magnet. Since the strap only carries the flux of the statistical fluctuation of the magnetic induction, it requires only a small cross sectional area and typically is a very thin layer of uniform thickness. For a further description, reference is had to a copending application, Ser. No. 08/613,756, filed Feb. 26, 1996, now U.S. Pat. No. 5,798,680, and a paper entitled "Strapping Techniques For Permanent Magnets, IEE Transactions On Magnetics, 32/5, September 1996, Pgs. 5082–5084, whose contents are herein incorporated by reference.

"Unipolar magnetic structure" is used herein in the sense that a single magnetic pole piece of a magnetic structure functions as a platform adjacent a cavity for receiving an object to be analyzed, the single magnetic pole generating flux in the region of interest within the cavity, whereas the magnetic structure, rather than a second distinct pole piece, collects that magnetic flux. In a unipolar magnetic structure, there typically will not exist a single opposed magnetic element that can perform the function of a second magnetic pole piece.

A "uniform magnetic field" means a magnetic field that over a region of interest has an intensity that varies by less than 100 ppm.

The term "substantially" appears from time to time in the specification and claims. It should be understood in a practical sense to mean small variations in some structure or parameter term that do not make significant changes in properties associated with those structures or parameters and are included within the scope of the associated term. For example, "substantially uniformly-magnetized blocks" recognizes that, while identical magnitude and orientation of the field in similarly configured blocks is desired, the usual material and dimensional tolerances do not allow this ideal to be attained. Where a "substantially plane surface" is defined, this is meant to include the addition to the surface of, for example, thin filter structures or other field distortion compensating means which could result in unevenness but in which the surface would still be essentially planar.

SUMMARY OF INVENTION

The principal object of the invention is a improved open unipolar magnetic structure allowing an arbitrary location of the region of interest which will contain the uniform magnetic field.

This object is achieved in accordance with one aspect of the invention by a yoked magnetic structure that is modified to reduce the perturbations in the region of interest when the latter is arbitrarily located within the cavity. Put another way, the region of uniform field is extended outside the opening with the result that the region of interest can, in a preferred embodiment, be moved closer to the opening.

In a preferred embodiment, the modification includes the provision of supplemental permanent magnetic members at the opening, the configuration of the supplemental permanent magnetic members being related to the configuration of some of the permanent magnetic members of the magnetic structure that provides the main magnetic field.

In a further preferred embodiment of the invention, two of the permanent magnetic members of the magnetic structure have a triangular or wedge shape with an apex angle determined by a design parameter K of the structure. (The design parameter K is explained in several of the referenced prior applications.) The supplemental permanent magnetic members are attached to the ends of the yoke defining the opening, and those supplemental permanent magnetic members are also triangular or wedge-shaped and have substantially the same apex angle.

The various features of novelty which characterize the invention are pointed out with particularity in the claims annexed to and forming a part of this disclosure. For a better understanding of the invention, its operating advantages and specific objects attained by its use, reference should be had to the accompanying drawings and descriptive matter in which there are illustrated and described the preferred embodiments of the invention, like reference numerals or letters signifying the same or similar components.

DETAILED DESCRIPTION OF PREFERRED EMBODIMENTS

Figure 1:
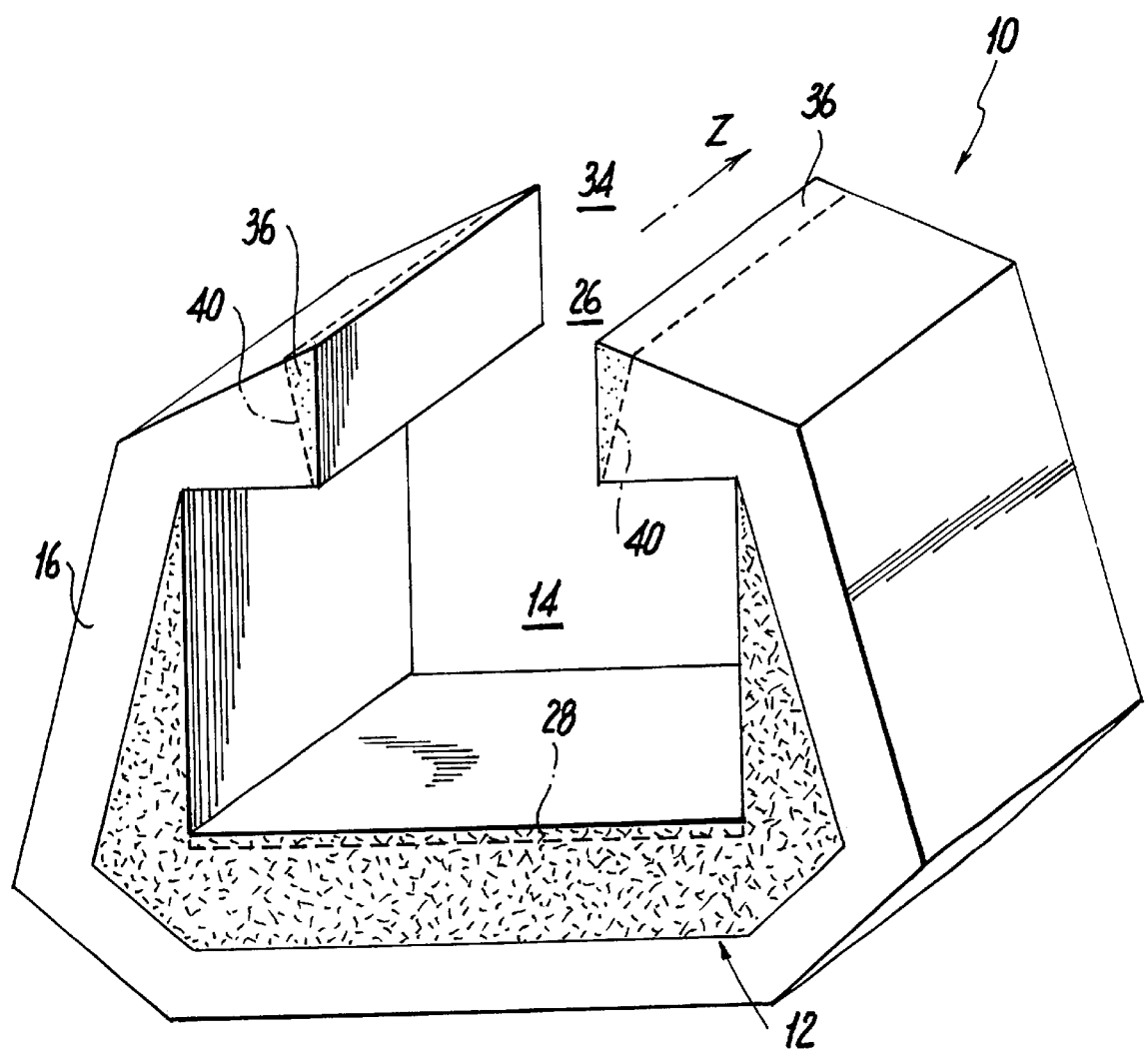
FIG. 1 is a perspective view of one form of open unipolar magnetic structure in accordance with the invention with some typical outside dimensions included.

The present invention builds on the open unipolar magnetic structures of the yoked type whose construction and design are described in great detail in the referenced parent application, buttressed by the other documents referenced. In particular, the published PCT application that corresponds to the referenced parent application is WO 99/56293. There is no need to repeat any details already described in the PCT application, which details now can be considered accessible to those skilled in the art. Readers who desire a better background for understanding the present improvement are urged to consult the published PCT application. However, to provide a foundation for the terms used in the specification and claims, a brief description will be given of a preferred embodiment of a yoked form of open unipolar magnetic structure.

This preferred embodiment will have a symmetrical structure about the Y or vertical axis, as it turns out that it is easier to design and configure such a magnetic structure for a chosen design parameter, which is referred to in the PCT application as the parameter K. For a yoked structure, K is a basic design parameter used in the design methodology of the magnetic structure, as described in the referenced parent and PCT applications. The chosen parameter K determines the magnitude Ho of the uniform field, where $\mu$ Ho=K Jo, and $\mu$ is the magnetic permeability of vacuum and Jo is the remanence of the chosen permanent magnetic materials. The preferred permanent magnetic materials are those with the highest magnetic properties especially remanence, currently the rare earth magnets such as Nd,B,Fe. Typical Ks are between 0.2 and 0.5. The value of K chosen determines the design of the permanent magnetic members of the structure responsible for principally generating the main magnetic field Ho. This is all explained in the referenced applications and patents and no further details are necessary here.

The typical open yoked construction is made up of prism-shaped blocks of permanent magnetic material arranged along the sides and bottom of the structure. The permanent magnetic block at the bottom is typically a rectangular-shaped block whose width (the horizontal dimension typically shown in the drawings) extends in the X direction of an arbitrary XYZ coordinate system, whose height (the vertical dimension typically shown in the drawings) extends in the Y direction, and whose length (often its longest dimension, typically extends in a direction perpendicular to the plane of the drawings) extends in the Z direction. In a typical MRI machine, the main field is in the Y direction, and the long dimension of the machine is in the Z direction. The drawings in the present application that are sections or end views are taken along the Z direction, i.e., in the XY plane, as this is adequate to explain the invention. For a perspective view shown with respect to a patient, see FIG. 1 of the PCT application.

Building a closed magnetic structure to produce on its interior a uniform magnetic field is a relatively simple task, but once the structure is opened the symmetry is destroyed and major perturbations in the magnetic field within a desired region of interest are encountered. The referenced parent application shows how to configure such a system with a plane high-permeability member on the bottom inner surface of the structure, i.e., how to design the permanent magnetic members of the structure, so as to produce at the opening the desired equipotential surface (represented by the hypothetical high-permeability membrane) to achieve a uniform magnetic field within a region of interest within the cavity interior of the structure. While the gross part of the structure eliminates or reduces the major perturbations, it is often necessary so-to-speak to fine tune the structure. Preferably, this is carried out by adding to the structure at certain locations filter or other structures which compensate for residual field non-uniformities and in general do this by extending equipotential planes. As mentioned above, however, the most uniform field tends to be close to the high-permeability member at the bottom, and that therefore will be the location of the region of interest.

The present invention modifies the yoked structure to allow a more arbitrary location of the region of interest, preferably closer to the opening. One form of an open unipolar magnetic structure according to the invention is illustrated in FIG. 1. The structure 10 comprises a main assembly 12 of prism-shaped blocks of permanent magnetic material surrounding a cavity 14, with the blocks in turn surrounded by a ferromagnetic yoke 16. The permanent magnetic blocks are shown dotted. In this embodiment, the main assembly 12 which is mainly responsible for producing the magnetic field Ho within the cavity 14 comprises, as shown in more detail in FIG. 2, a bottom rectangular block 18 flanked at opposite corners by small triangular blocks 20, and the latter in turn are attached to larger triangular blocks 22 that extend along opposite sides of the cavity 14. The orientation and magnetization of the respective permanent magnetic blocks are indicated by the symbols J and their magnetization direction by the arrow next to the symbol. For convenience of design, the structure is symmetrical about a verical center axis 24 corresponding to the Y axis. In other words, the two pairs of blocks 20 and 22 are, respectively, substantially identical to each other within the usual manufacturing tolerances. Preferably, the blocks 18, 20, 22 are of rare earth magnetic material, and the yoke 16 may be of soft iron. In this particular embodiment, the cavity 14 is rectangular.

Figure 4:
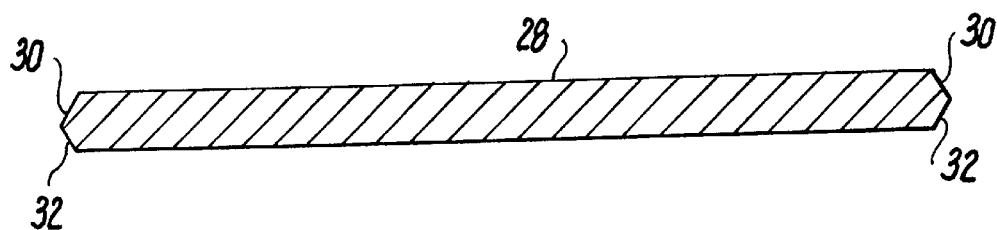
FIG. 4 is an enlarged cross-sectional view of the plane high-permeability member that interfaces with the cavity present in the embodiment of FIG. 1.

The dimensions given in mm are for a single example and are not intended to be limiting. The design shown is for a K=0.25. For other values of K, the dimensions would necessarily change. Higher K values will require more permanent magnetic material and more ferromagnetic material to handle the flux. It should be noted that the outer surfaces of the permanent magnetic blocks 18, 20, 22, contacted by the yoke, are equipotential surfaces evident from the directions of the vectors J perpendicular to those surfaces. For clarity, the lightly dotted material is permanent magnetic, and the more heavily dotted material is the yoke. As described in the parent application, the upper surface of the rectangular block 18 is covered with a plane high-permeability member (indicated by the heavy line 28) which establishes at its interface with the cavity 14 an equipotential surface. Preferably, as described in the parent application, the ends of the high permeability member 28 are shaped so as to be parallel to the facing outer surfaces of the adjacent permanent magnetic blocks. FIG. 4 shows one example of the member 28 with angled edge surfaces 30, 32. The surface 30 is shaped parallel to the surrounding magnet surface 34, and the surface 32 is shaped parallel to the surrounding magnet surface 36. This enhances the field uniformity. FIG. 6B of the PCT application shows another suitable arrangement. Except for the dimensions and the hatched members shown bordering an opening 26 in the structure that provides the desired access to the cavity 14, the structure corresponds to a design derivable from the parent application designed with the hypothetical membrane, in which case, the region of interest would be a generally spherical region located in the cavity close to the high-permeability plate 28. To move the region of interest closer to the opening 26 for easier surgical access, the field uniformity must be moved up through the opening 26 to the surrounding non-magnetic medium 34, as the uniformity degrades up along the Y axis from the high-permeability plate 28. This is accomplished in a preferred embodiment by attaching two supplemental permanent magnetic prism-shaped blocks 36 each to one of the adjacent sides 40 of the yoke that would border the opening 26 if the magnets 36 were not present. The vector J shows the magnetization of the blocks 36 which is perpendicular to the adjacent yoke surfaces 40, which are thus equipotential surfaces.

The height (in the Y direction) of the supplemental permanent magnetic members 36 determines the uniformity of the field within the cavity 14. FIG. 3 is a graph plotting By (the remanence along the Y axis) as a function of Y measured from the point Y=0, with positive values of Y at points extending down into the cavity 14 and with negative values of Y extending upwardly. The curves A, B, C, D, and E, were made for a particular geometry with a K=0.25, and with respective values of Py in mm (see FIG. 2) varying from 0.0 for curve A to 2.0 for curve E. The asymptote at the right axis represents the maximum field possible for this particular geometry where K=0.25. As will be observed, as the height Py of the supplemental permanent magnetic members 36 increases, the uniformity of the field increases especially in the regions closer to the entrance of the opening 26. As used herein, the "entrance of the opening 26" is at the dashed line 50, and the opening "exit" is at the interface to the outside medium 34, which interface is at a line B–B'.

Figure 2:
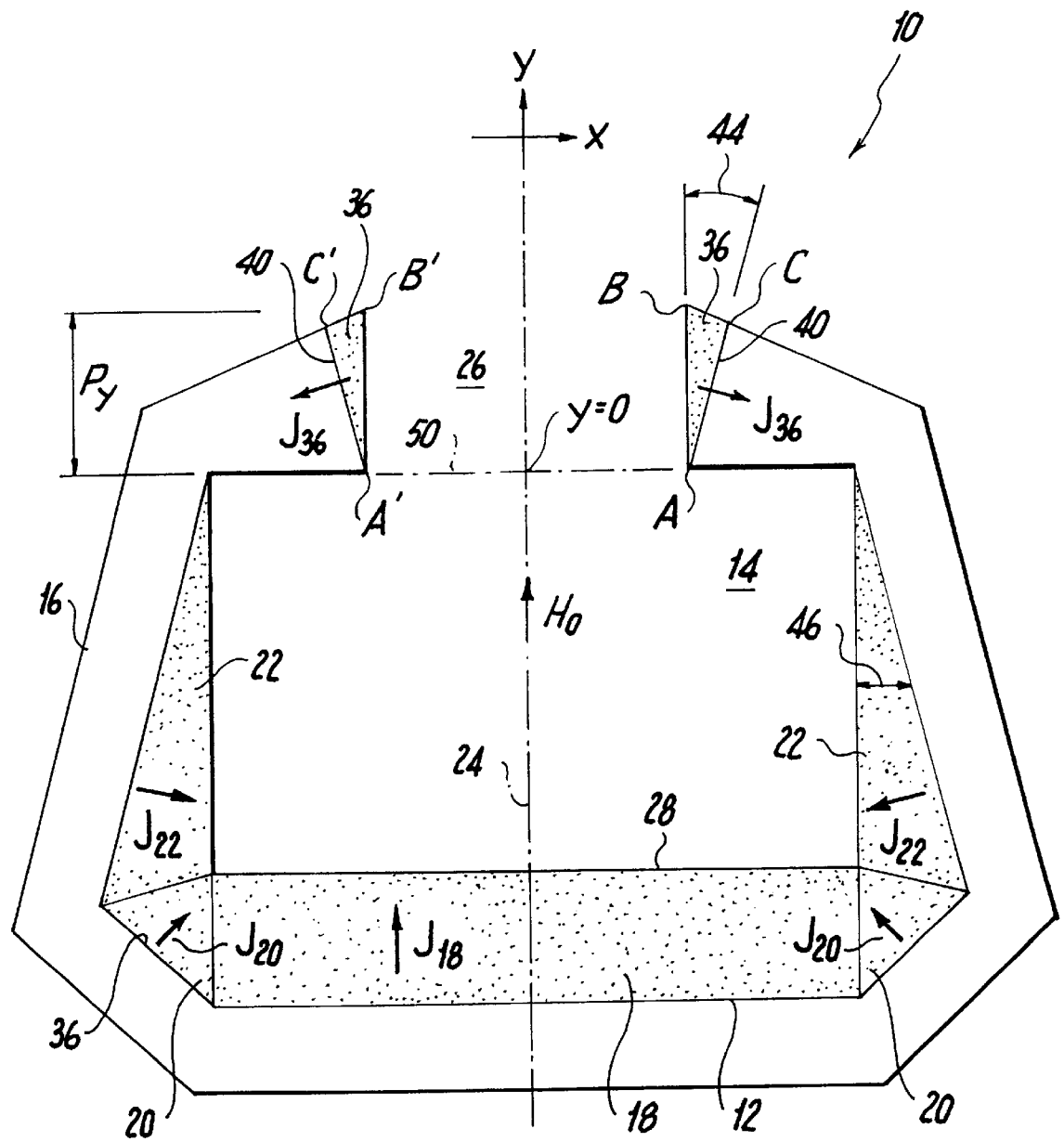
FIG. 2 is an end or cross-sectional view of the embodiment of FIG. 1 showing additional details of the structure.
Figure 3:
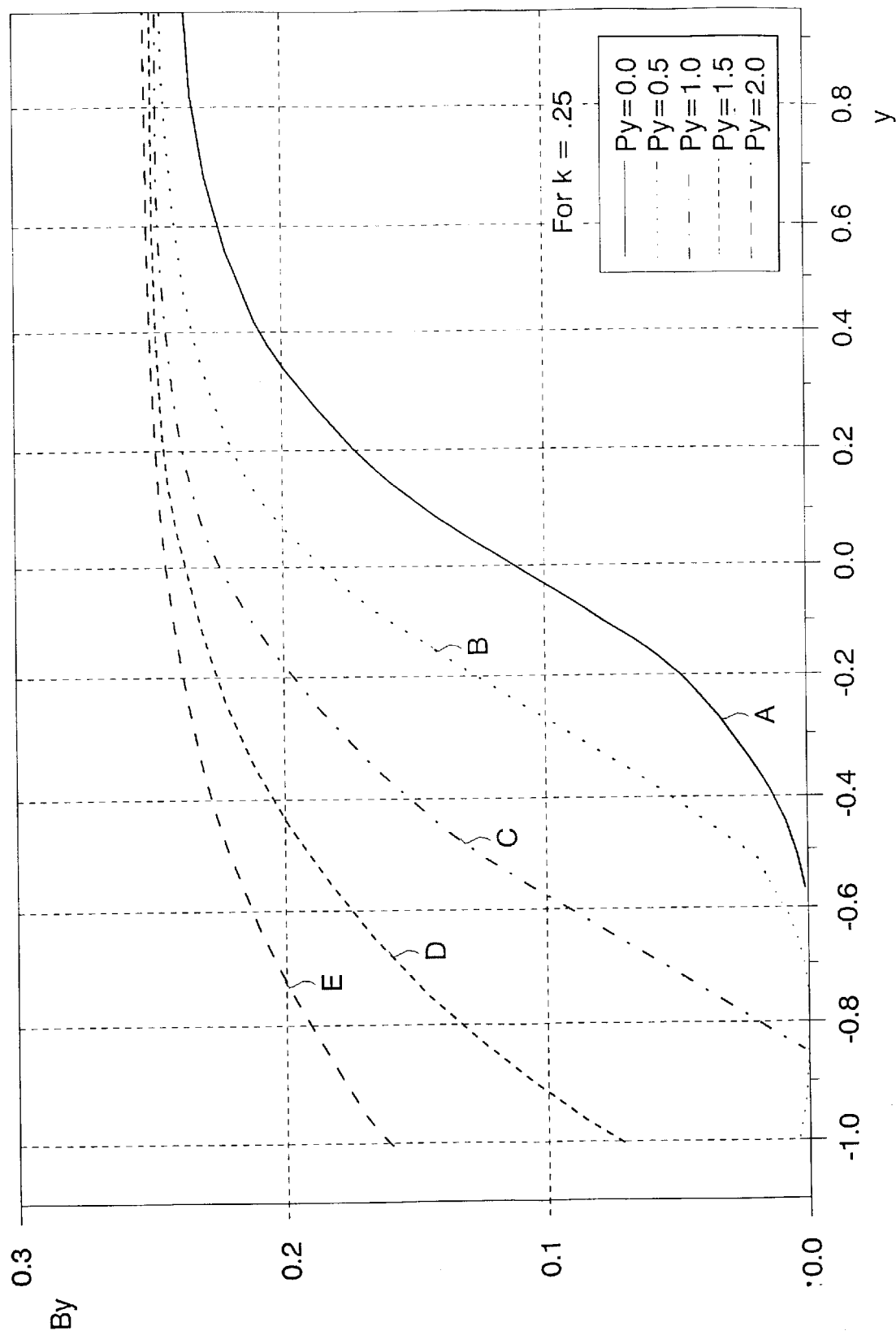
FIG. 3 is a graph illustrating for one particular design the effect on the field within the cavity as the height of the structure adjacent the opening is varied.

As illustrated in FIG. 2, the triangular-shaped supplemental permanent magnetic members 36 have an apex angle 44 (angle BAC) at the line represented by the points A, A' that is equal to 14.5°. The value is the same for both members 36, i.e., angle B'A'C'=14.5°. That angle is related to and is determined by the design parameter K of the geometry, to wit, K=the sine of the apex angle 44. Choosing a larger design parameter K for the design requires a larger apex angle 44. For example, if the design parameter K were chosen to be 0.5, then the apex angle 44 chosen should equal 30°. It is also important that the apex angle 46 of the side permanent magnet members 22 should also be the same as that of the supplemental permanent magnetic members 36, as indicated in FIG. 2. Again, both side permanent magnetic members 22 have the same geometry.

Other preferred features of the preferred embodiment for best results are that the outer surfaces, sides AC, A'C', of the supplemental permanent magnetic members 36 should be equipotential surfaces, and the supplemental permanent magnetic members 36 should be attached directly to the yoke end surfaces 40 without any intervening gaps.

The region of interest would typically be a spherical region within the cavity, centered where the geometry is symmetrical at a position where the degree of uniformity is acceptable, typically a uniformity that does not vary by more than 0.1–1.0% over the whole of the region of interest. For the specific embodiment described above, the region of interest at the center of the cavity 14 would have a spherical diameter of about 200–250 mm. To make the region of interest larger requires that the supplemental permanent magnetic members 36 have their height increased, as indicated in the graph of FIG. 3.

As described in the parent application, the magnetic design methodology of the structure 10 which includes the dimensions and magnetizations of the prism-shaped permanent magnetic blocks which produce the desired field Ho—this is what is meant by "configuring" the structure—is carried out for a given design parameter K and with the design constraint of an equipotential surface at the entrance to the opening 26, represented by the dashed line 50. This is the equivalent of the equipotential surface formed by having a high-permeability membrane parallel to the single pole piece 28 present and which closes off the interface at dashed line 50 and thus the opening. This assumed hypothetical high-permeability membrane in effect provides a closed cavity in the XY planes (though open at the cavity ends along the Z axis). Without the hypothetical membrane present providing the opening 26, the major perturbations of the uniform field within the cavity will have been compensated by this design. The addition of the supplemental permanent magnetic wedges 36 allows the uniform field to be extended up into the opening thus allowing the region of interest to be moved closer to the opening.

To fine tune the structure will normally require the addition of filter or other compensating structures as described in the referenced applications, and in particular in U.S. Pat. No. 5,475,355. The filter structures (not shown), which typically are thin sandwiches of outer soft ferromagnetic plates with a permanent magnetic member between the plates and with the outer plate insulated from the structure, are positioned wherever needed along the cavity interior to further minimize field distortion. The best places are along or on or embedded in those interior equipotential surfaces bearing the heavier black lines in FIG. 2. Generally, the position of the filter structures also locates the optimum location of the region of interest. For example, if the region of interest is closer to the bottom, so would the filter structures be positioned closer to the bottom.

It will be recognized that the invention is not limited to structures with rectangular cavities, or to symmetrical structures, or to structures with the dimensions indicated in the drawings, which are only to illustrate the size of a particular embodiment. The geometry shown, which is preferred, with the rectangular permanent magnetic block 18 at the bottom flanked by small triangular-shaped blocks 20 forming a rectangular polygonal cavity can be replaced by other geometries of one or more uniformly magnetized blocks. However, the triangular-shaped wedge-shaped blocks 22 along the sides are important to ensure matching of its apex angles 46 to that 44 of the wedge-shaped supplemental blocks 36 flanking the opening 26. These other geometries are also considered within the scope of the invention.

It will also be understood that the invention is not limited to the specific shape of the yoke 16, and other yoke geometries are also considered within the scope of the invention so long as saturation is avoided.

While the invention has been described in connection with preferred embodiments, it will be understood that modifications thereof within the principles outlined above will be evident to those skilled in the art and thus the invention is not limited to the preferred embodiments but is intended to encompass such modifications.

What is claimed is:

1. A magnetic structure for generating a uniform magnetic field within a region of interest, comprising:

a) a plurality of substantially uniformly-magnetized, prism-shaped blocks of permanent magnet material being positioned around a cavity within the magnetic structure, b) a high-permeability ferromagnetic yoke surrounding the prism-shaped blocks and having first and second ends defining an opening between its ends, c) said magnetic structure having a substantially plane surface comprising a high permeability ferromagnetic member interfacing with the cavity and forming a single pole piece of the magnetic structure spaced from the opening, said opening providing access to the region of interest and said opening being opposed to the high permeability ferromagnetic member forming the single pole piece, said magnetic structure lacking a discrete second pole piece at the location of the opening, said magnetic structure portions adjacent the opening collecting the magnetic flux flowing through the single pole piece and through the cavity though lacking the second discrete pole piece, d) the orientation of the uniform magnetic field in the region of interest extending perpendicular to the substantially plane surface, e) first means magnetically connected to said magnetic structure and configured to produce within a desired region of the cavity the region of interest having the uniform magnetic field and that is accessible from the opening, said first means including supplemental blocks of permanent magnetic material magnetically connected to the first and second yoke ends.

2. A magnetic structure for generating a uniform magnetic field within a region of interest, comprising:

a) a plurality of substantially uniformly-magnetized, prism-shaped blocks of permanent magnet material being positioned around a cavity, b) a high-permeability ferromagnetic yoke surrounding the prism-shaped blocks and having spaced ends defining an opening between its ends, said opening having an entrance from the cavity and an exit at a surrounding medium, c) said magnetic structure having a substantially plane surface comprising a high permeability ferromagnetic member interfacing with the cavity and forming a single pole piece of the magnetic structure spaced from the opening, said yoke end opening providing access to the region of interest and being opposed to the high permeability ferromagnetic member forming the single pole piece, said magnetic structure lacking a discrete second pole piece at the location of the opening, d) said magnetic structure being configured to produce within a desired region of the cavity the region of interest having the uniform magnetic field within it and collecting the magnetic flux flowing through the single pole piece and through the cavity via the magnetic structure adjacent the opening, e) said prism-shaped blocks of permanent magnet material being responsible for the generation of the uniform magnetic field within the region of interest, f) said prism-shaped blocks including first and second blocks located on opposed sides of the magnetic structure, g) at least two supplemental prism-shaped blocks of permanent magnetic material, each of said supplemental prism-shaped blocks being magnetically connected to one of the yoke ends and being sized so as not to substantially reduce the size of the opening, said supplemental prism-shaped blocks being configured with relation to the configuration of the first and second prism-shaped blocks such that the region of interest with the uniform magnetic field is positioned within the desired region of the cavity.

3. A magnetic structure for generating a uniform magnetic field within a region of interest as claimed in claim 2, wherein the high permeability ferromagnetic member interfaces with a first side of the cavity, said cavity at a second side generally opposite to the first side having the opening extending to the surrounding medium and forming an interface with the surrounding medium but not with a magnetic member at the open second side, said magnetic structure having been configured such that an equipotential surface is formed at the opening entrance extending the uniform field up to the opening entrance, the presence of the supplemental prism-shaped blocks extending the uniform field up to the opening exit.

4. An open magnetic structure within a non-magnetic surrounding medium for generating a uniform magnetic field within a region of interest, comprising:

a) a plurality of substantially uniformly-magnetized, prism-shaped first blocks of permanent magnet material being positioned around a cavity, the region of interest being positioned within the cavity, b) said magnetic structure having a substantially plane surface comprising a high permeability ferromagnetic member interfacing with a first side of the cavity, c) said cavity at a second side generally opposite to the first side having an opening spaced from and opposed to the substantially plane surface and with an entrance at the cavity and an exit forming an interface with the surrounding medium at the second side of the cavity, the cavity at the open second side not interfacing with a magnetic medium, d) said magnetic structure having been configured such that an equipotential surface is formed at the opening entrance extending the uniform field up to the opening entrance, e) the orientation of the uniform magnetic field in the region of interest extending perpendicular to the substantially plane surface, f) permanent magnetic compensating means located adjacent to the opening and configured to extend the uniform field up to the opening exit to compensate for perturbations in the magnetic field within the region of interest due to the opening to the immediately surrounding medium when the said region of interest is arbitrarily located within the cavity.

5. A magnetic structure for generating a uniform magnetic field within a region of interest as claimed in claim 4, wherein the magnetic structure is yoked.

6. A magnetic structure for generating a uniform magnetic field within a region of interest as claimed in claim 5, wherein the yoke has opposed ends defining the opening, said exposed ends forming equipotential surfaces.

7. A magnetic structure for generating a uniform magnetic field within a region of interest as claimed in claim 6, wherein the permanent magnetic compensating means comprises second and third prism-shaped permanent magnetic blocks each attached to one of the yoke ends, said second and third prism-shaped blocks being configured with relation to the configuration of the first prism-shaped blocks such that the region of interest with the uniform magnetic field is positioned closer to the opening.

8. An open magnetic structure within a non-magnetic surrounding medium for generating a uniform magnetic field within a region of interest, comprising:

a) a plurality of substantially uniformly-magnetized, prism-shaped first blocks of permanent magnet material being positioned around a cavity, the region of interest being positioned within the cavity, b) said magnetic structure having a substantially plane surface comprising a high permeability ferromagnetic member interfacing with a first side of the cavity, c) said cavity at a second side generally opposite to the first side having an opening spaced from the substantially plane surface and with an entrance at the cavity and an exit forming an interface with the surrounding medium at the second side of the cavity, the cavity at the open second side not interfacing with a magnetic medium, d) said magnetic structure having been configured such that an equipotential surface is formed at the opening entrance extending the uniform field up to the opening entrance, e) the orientation of the uniform magnetic field in the region of interest extending perpendicular to the substantially plane surface, f) permanent magnetic compensating means located adjacent to the opening and configured to extend the uniform field up to the opening exit to compensate for perturbations in the magnetic field within the region of interest due to the opening to the immediately surrounding medium when the said region of interest is arbitrarily located within the cavity, g) the magnetic structure having a design parameter K, the first prism-shaped blocks comprising two wedge-shaped blocks located on opposite sides of the cavity, each of said wedge-shaped blocks having a predetermined apex angle dependent upon the design parameter K of the magnetic structure wherein $K=\mu Ho/J$, Ho is the magnitude of the uniform magnetic field, $\mu$ is the magnetic permeability of vacuum, and J is the remanence of the first prism-shaped blocks of permanent magnet material, the second and third prism-shaped blocks also having a wedge shape with an apex angle which is substantially the same as that of the wedge-shaped blocks of the first prism-shaped blocks.

* * * * *